United States Patent [19]

Watanabe et al.

[11] Patent Number: 4,802,128

[45] Date of Patent: Jan. 31, 1989

[54] BIT LINE DRIVER

[75] Inventors: Kazuo Watanabe, Kanagawa; Shumpei Kohri, Tokyo; Shigeo Araki, Kanagawa, all of Japan

[73] Assignee: Sony Corporation, Tokyo, Japan

[21] Appl. No.: 849,962

[22] Filed: Apr. 10, 1986

[30] Foreign Application Priority Data

Apr. 12, 1985 [JP] Japan .................................. 60-77953

[51] Int. Cl.$^4$ ................................................ G11C 7/00
[52] U.S. Cl. ...................................... 365/203; 365/190
[58] Field of Search ................ 365/190, 202, 203, 154

[56] References Cited

U.S. PATENT DOCUMENTS

| 4,112,506 | 9/1978 | Zibu | 365/181 |
|---|---|---|---|
| 4,355,377 | 10/1982 | Sud et al. | 365/203 |
| 4,479,202 | 10/1984 | Uchida | 365/190 |
| 4,494,221 | 1/1985 | Hardee et al. | 365/203 |
| 4,494,221 | 1/1985 | Hardee | 365/203 |

FOREIGN PATENT DOCUMENTS

| 0121208 | 3/1984 | European Pat. Off. |
| 0136811 | 8/1984 | European Pat. Off. |

OTHER PUBLICATIONS

K. Hardee et al., "A 30 ns 64K CMOS RAM", 1984 IEEE International Solid-State Circuits Conference, Digest of Technical Papers, pp. 216-217.

Primary Examiner—Joseph A. Popek
Attorney, Agent, or Firm—Ronald P. Kananen

[57] ABSTRACT

In a bit line driver for MOS memory units of a microcomputer, which is connected between a pair of complementary bit lines and provided with an equalizing MOS transistor, a pair of active-load MOS transistors and a pair of clamping MOS transistors are connected separately to the complementary bit lines, and further the area of the clamping MOS transistors is determined to be about three times greater than that of the active-load transistors. An increase in the area of the clamping MOS transistors serves to decrease the internal resistance thereof, so that the clamping operation can be improved. A decrease in area of the active-load MOS transistor serves to increase the internal resistance, so that the access time can be improved. In addition, the driver can operate stably in response to a low power clock pulse.

8 Claims, 4 Drawing Sheets

DATA READ TIMING

DATA READ OPERATION

DATA READ TIMING

DATA READ OPERATION

BIT LINE DRIVER

BACKGROUND OF THE INVENTION

1. Field of the Invention

The present invention relates generally to a bit line driver for a static read only memory of a microcomputer and more specifically to a bit line driver connected between a pair of complementary bit lines and having equalizing MOS transistors.

2. Description of the Prior Art

Conventionally, MOS memory units with a number of memory cells composed of MOS transistors arranged so as to write or read information in accordance with any given and selected addresses have widely been used as a storage device for an electronic computer. In order to shorten the access time of the MOS memory, it is necessary to increase the load resistance. However, as usual, since two MOS transistors are connected as active loads so as to function as a clamper, in order to obtain good clamping characteristics, it is necessary to sufficiently decrease the inner resistance of the two MOS transistors. In other words, two contradictory conditions have been required for a prior-art bit line driver in a MOS memory unit. Further, there exists another problem in that a high output clock amplifier is required to effect a precharge operation and equalization operations simultaneously. Furthermore, there exist the other drawbacks such that the stray capacitance of the bit lines is relatively great, causing a long discharge time and thereby preventing high speed operation.

The arrangement and operation of the prior art bit line driver for a MOS memory unit will be described in further detail with reference to the attached drawings in the detailed description of the preferred embodiment.

SUMMARY OF THE PRESENT INVENTION

With these problems in mind thereof, it is a primary object of the present invention to provide a bit line driver which can solve the above-mentioned contradictory conditions, with the by use of a low power output clock amplifier while increasing the operation speed.

To achieve the above-mentioned object, in a bit line driver connected between a pair of complementary bit lines and having an equalizing MOS transistor for effecting equalization operation by shorting a pair of the complementary bit lines in response to a clock pulse applied to a gate of the MOS transistor, the driver according to the present invention comprises: (a) a pair of active-load MOS transistors, each connected between one of the complementary bit lines and a power supply, each gate of said active-load MOS transistor being connected to ground., and (b) a pair of clamping MOS transistors each connected in parallel to one of said active-load MOS transistors, each of the clamping MOS transistors being diode connected. When the equalizing MOS transistor, the two active-load MOS transistors and the two clamping MOS transistors are all of the P-channel type, each drain of the two active-load P-channel MOS transistors is connected to one of a pair of the complementary bit lines., each source of the two active-load P-channel MOS transistors is connected to the power supply., and each drain and each source of the two clamping P-channel MOS transistors are connected in parallel to each drain and each source of said two active-load P-channel MOS transistors. Further, the area of the clamping MOS transistors is determined to be about three times greater than that of the active-load MOS transistors and the equalizing MOS transistor.

An increase in area of the clamping MOS transistors decreases the internal resistance thereof, so that the clamping operation can be improved, while a decrease in area of the active-load MOS transistors increases the internal resistance thereof, so that the access time can be improved. In summary, according to the present invention, a high load resistance and a sharp clamping characteristic are obtained simultaneously. Further, the driver operates stably on the basis of a low power clock pulse.

BRIEF DESCRIPTION OF THE DRAWINGS

The features and advantages of the bit line driver according to the present invention over the prior art bit line driver will be more clearly appreciated from the following description of the preferred embodiment of the invention taken in conjunction with the accompanying drawings in which like reference numerals designate the same elements or sections throughout the figures thereof and in which.

DETAILED DESCRIPTION OF THE PREFERRED EMBODIMENT

To facilitate understanding of the present invention, a reference will first be made to a prior-art bit line driver, with reference to the attached drawings.

Figure 1:
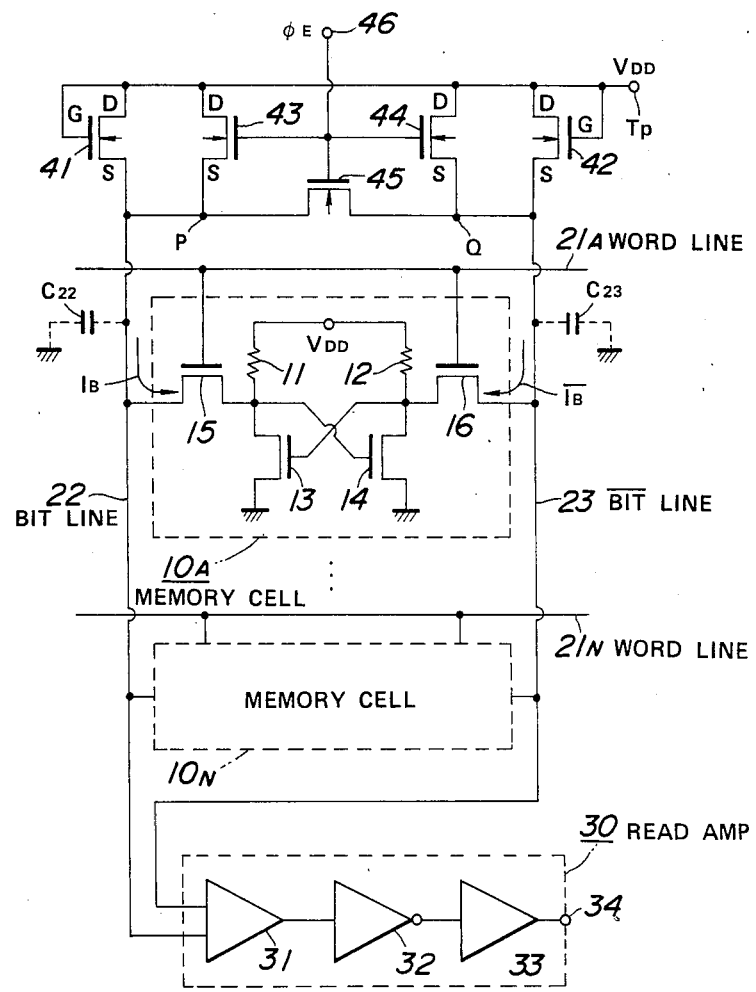
FIG. 1 is a schematic block diagram showing a prior-art bit line driver.

FIG. 1 shows an example of the circuit configurations of a prior art MOS memory unit. In FIG. 1 the reference numeral 10 {(10A) ... (10N)} denotes static type memory cells each having a flip-flop circuit composed of two load resistors 11 and 12 and two N-channel MOS transistors 13 and 14 so as to store information by turning on or off the current. When a number of such memory cells 10 as described above are collected, a memory matrix (not shown) can be configured.

The reference numeral 21 (21A ... 21N) denotes X addresses (word lines), and the numerals 22 and 23 denote a pair of complementary Y addresses (bit line and $\overline{\text{bit}}$ line). In read or write operations, when a word line such as 21A, for instance, is selected by an X decoder (not shown), MOS transistors 15, 16 in a memory cell 10A connected to the selected word line 21A are turned on to activate the memory cell 10A. In this case, although all the memory cells connected to the same word line 21A are activated, since a predetermined address such as, for instance, the bit line 22 and the $\overline{\text{bit}}$ line 23 are also selected by a Y decoder (not shown), the determined memory cell 10A is activated to permit reading or writing of information.

The reference numeral 30 denotes an entire read amplifier. The bit line 22 and the $\overline{\text{bit}}$ line 23 are connected to a first-stage differential amplifier 31 of the read amplifier 30. An output of this differential amplifier 31 is amplified to a desired voltage level by a driving-stage inversion amplifier 32 and an output-stage buffer amplifier 33 and then outputted through an output terminal 34.

Diode-connected N-channel MOS transistors 41 and 42 are clampers serving also as active loads of the flip-flop circuit 10A, each drain and each gate of which are connected to a power supply terminal $T_p$ and each source of which is connected respectively to the bit line 22 and the $\overline{\text{bit}}$ line 23. Each source and each drain of precharging N-channel MOS transistors 43 and 43 are connected in parallel with each source and each drain of the MOS transistors 41 and 42, respectively. Further, the source and drain of an equalizing N-channel MOS transistor 45 are connected between two intermediate junction points P and Q, that is, between the bit line 22 and the $\overline{\text{bit}}$ line 23. The gates of each of the three MOS transistors 43, 44 and 45 are all connected to a clock input terminal 46.

The prior-art MOS memory as shown in FIG. 1 operates as follows:

First, an assumption is made that one MOS transistor 13 of the flip-flop in the memory cell 10A is on and the other MOS transistor 14 is off. Since the gates of the active load-clamping MOS transistors 41 and 42 are both connected to the power supply terminal $T_p$, these transistors 41 and 42 are always kept on, so that the stray capacity $C_{22}$ of the bit line 22 is being charged up through the MOS transistor 41.

Figure 2:
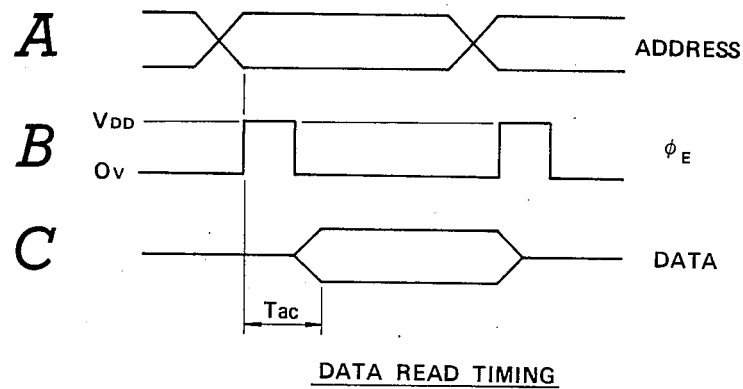
FIG. 2 is a waveform diagram showing the data read timing for assistance in explaining the operation of the prior-art bit line driver shown in FIG. 1.

In response to address inputs as shown in FIG. 2(A), the word line 21A, the bit line 22 and $\overline{\text{bit}}$ line 23 are selected by an X decoder and a Y decoder (both of which are not shown). By this step, the MOS transistors 15 and 16 in the memory cell 10A are turned on.

A clock $\phi_E$ as shown in FIG. 2(B) formed by an address transition detector (not shown) in response to the address input shown in FIG. 2(A) is supplied to the clock input terminal 46. When the clock $\phi_E$ changes to an "H" (high) voltage level, the precharging N-channel MOS transistors 43 and 44 and the equalizing N-channel MOS transistor 45 are all turned on, because each gate thereof reaches the power supply voltage $V_{DD}$.

In this case, if the supply voltage $V_{DD}$ is 5 V, for instance, the potential at the points P and Q, that is, at the source and the drain of the equalizing MOS transistor 45 is as low as about 3.2 V, because of the influence of the threshold voltage $\Delta V$th of the diode-connected N-channel MOS transistors 41 and 42 and the substrate effect $\Delta V$th. Therefore, the equalizing MOS transistor 45 has a fairly high turn-on resistance, so that the transistor 45 cannot perfectly short the bit line 22 and the $\overline{\text{bit}}$ line 23. Therefore, in the prior-art example shown in FIG. 1, current is passed through the precharging MOS transistor 43 or 44 to equalize the potentials of the bit line 22 and the $\overline{\text{bit}}$ line 23. Here, this potential is assumed to be $V_{EL}$.

When the clock $\phi_E$ changes to an "L" (low) voltage level, since each gate voltage of the MOS transistors 43 to 45 drops down to the ground potential, these MOS transistors 43 to 45 are all turned off. Since the MOS transistor 14 in the memory cell 10A is off, the potential of the $\overline{\text{bit}}$ line 23 released from the connection with the bit line 22 is held at a constant level $V_{EL}$ due to the influence of the threshold voltage Vth of the MOS transistor 42 and the substrate effect $\Delta V$th.

On the other hand, since the MOS transistors 13 and 15 in the memory cell 10A are on, the absorption current $I_B$ flows into the bit line 22 through the active load-clamping MOS transistor 41. Here, since the clamping characteristic of the MOS transistor 41 is not so sharp as that of a bipolar transistor, the potential of the bit line 22 begins to drop to a value $V_L$ obtained by dividing the supply voltage $V_{DD}$ through an equivalent resistance voltage divider composed of the MOS transistors 13, 15, and 41. The speed of the voltage drop is dependent upon the stray capacitance $C_{22}$ and the equivalent resistance voltage divider.

When the potential of the bit line 22 reaches a predetermined potential $V_{CL}$ higher than the above-mentioned $V_L$, the voltage drop stops due to the clamping operation of the MOS transistor 41. In the case where the supply voltage $V_{DD}$ is 5 V, for instance, this clamped voltage $V_{CL}$ is about 2.6 V.

As described above, the voltage difference between points P and Q is amplified by the differential amplifier 31 of the read amplifier 30 and outputted from the output terminal 34 through the inversion amplifier 32 and the buffer amplifier 33. In this case, the output of the read amplifier 30 is the data from the memory cell 10 as shown in FIG. 2(C). It is preferable that the time Tac from when an address is determined to when data is read (access time) is as short as possible.

Once the data is read from the memory cell 10A, the clock $\phi_E$ is applied to the terminal 46, in the same way as previously stated, the potential at point P is restored from $V_{CL}$ to $V_{EL}$, and the data output disappears as shown in FIG. 2(C).

The relationship between the operation and the access time of the prior-art MOS memory as shown in FIG. 1 now will further be described with reference to FIG. 3.

Figure 6:
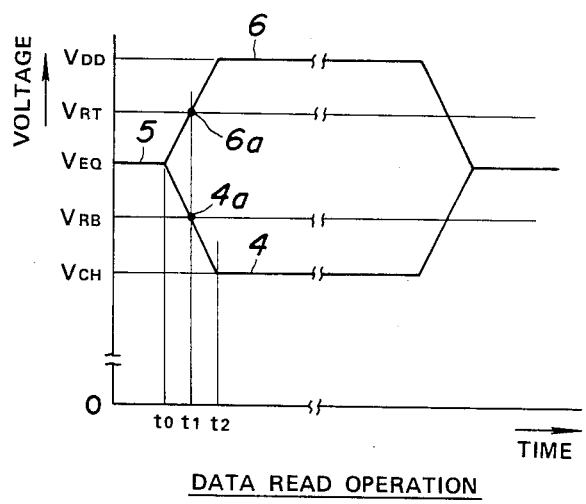
FIG. 6 is a graphical representation showing the data read operation for assistance in explaining the operation of the bit line driver shown in FIG. 4.

As already described, during the period in which the clock $\phi_E$ is at an "H" voltage level, the potentials of the bit line 22 and the $\overline{\text{bit}}$ line 23, that is, at the points P and Q are both at as shown by the solid line 1 in FIG. 6. From the time $t_0$ when the clock $\phi_E$ changes to an "L" voltage level, the potential at point P drops generally at a predetermined proportion as shown by the dot-dashed lines 2. During this transition time interval, the data is read from the memory cell 10A beginning from the time $t_2$ corresponding to a point $2a$ where the potential at point P reaches a predetermined reference potential $V_R$.

Figure 3:
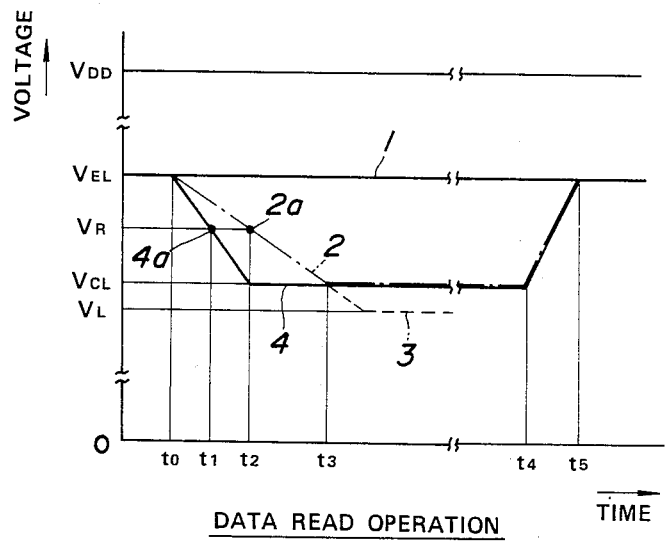
FIG. 3 is a graphical representation showing the data read operation for assistance in explaining the operation of the prior-art bit line driver shown in FIG. 1.

Therefore, in order to shorten the access time, it is preferable to shorten the transition time interval, in other words, to hasten the time point $4a$ ($t_1$) at which the potential at point P reaches the reference potential $V_R$ by changing the transition chracteristic from a gentle slope as shown by the dot-dashed line 2 in FIG. 3 to a sharp slope as shown by the solid line 4 in FIG. 3.

In the case where the voltage changes according to the time as described above, since $V=IR$, that is, $dv/dt = R \cdot dI/dt$, the gradient of the voltage change characteristic is dependent upon the resistance value and the current change rate (the degree of change in current per unit time). Therefore, it is possible to shorten the access time by increasing the load resistance.

In the prior-art bit line driver as shown in FIG. 1, however, the MOS transistors 41 and 42 both function as active loads for the bit line 22 and the $\overline{\text{bit}}$ line 23 and further operate as clamping circuits. In order to permit a preferable clamping operation, it is necessary to increase the area of the MOS transistors 41 or 42 in order to sufficiently reduce the internal resistance. However, this condition is contradictory to the condition such that it is necessary to increase the load resistance in order to shorten the access time. In the prior-art driver, therefore, the areas of the two MOS transistors 41 and 42 have been determined to be twice, for instance, larger than those of the precharging and equalizing MOS transistors 43 to 45 by compromising the above two contradictory conditions. However, there still exists a problem in that it is basically very difficult to determine transistor constants so as to obtain these preferable characteristics while taking the above-mentioned two contradictory conditions into consideration.

Further, in the prior art driver, since the three MOS transistors 43, 44 and 45 are driven by the clock signal $\phi_E$ for the precharging operation and the equalizing operation, the load of a clock amplifier (not shown) for supplying the clock signal $\phi_E$ to the input terminal 46 becomes large. Therefore, there exists another problem in that it is difficult to obtain an accurate clock signal $\phi_E$ without use of a high output clock amplifier.

Furthermore, in the prior art driver, since the potential of the bit line 22 and the $\overline{\text{bit}}$ line 23 is as low as $V_{EL} \doteq 2.3$ V, the P-N junction capacitance (diffusion capacitance) between the N-type diffusion layer and the substrate of the memory cell 10A included in the stray capacitances $C_{22}$ and $C_{23}$ of the bit line 22 and the $\overline{\text{bit}}$ line 23 is large, thus causing the other problem such that the charge/discharge time interval is long, thus preventing a high speed operation.

In view of the above description, reference is now made to an embodiment of the bit line driver according to the present invention, with reference to the attached drawings.

Figure 4:
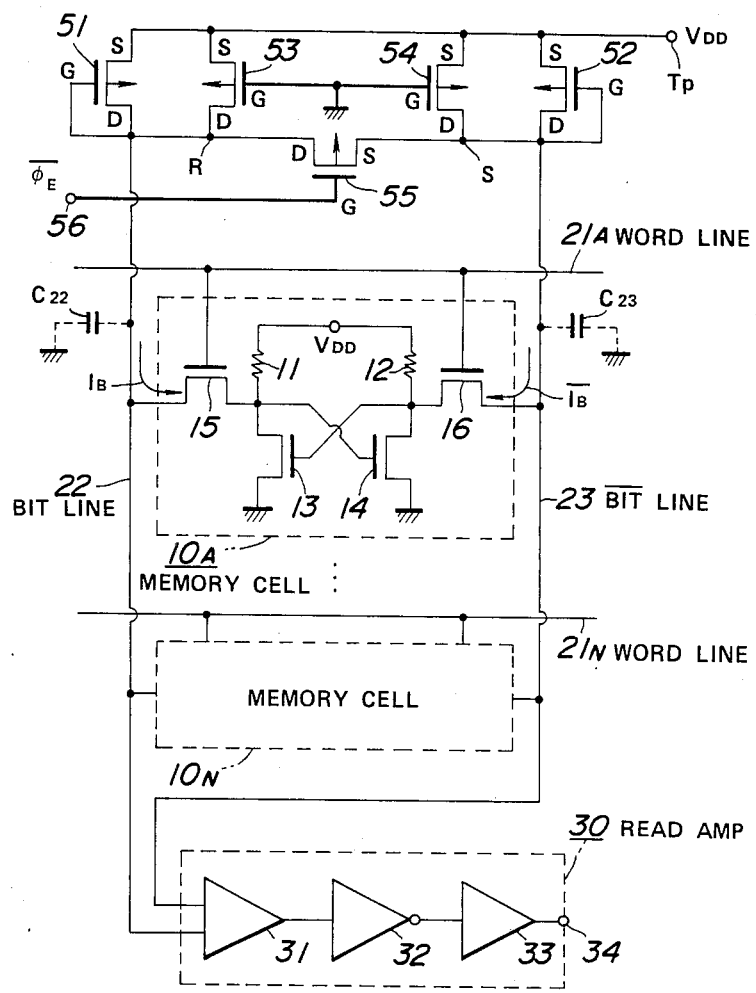
FIG. 4 is a schematic block diagram showing the bit line drive according to the present invention.

FIG. 4 shows a circuit diagram of the embodiment according to the present invention. In the drawing, many sections or elements of this embodiment are the same in function as those described in the prior-art bit line driver with reference to FIG. 1 except five MOS transistors. Therefore, the same reference numerals have been retained for similar parts which have the same functions, without making any detailed description of them.

In FIG. 4, the sources of two P-channel MOS transistors 51 and 52, which are diode-connected by respectively connecting the gate and the drain of each of the transistors 51 and 52, are connected to the power supply terminal $T_p$. To each source and each drain of these MOS transistors 51 and 52, the source and the drain of two P-channel MOS transistors 53 and 54 having a grounded gate are connected in parallel. The bit line 22 and the $\overline{\text{bit}}$ line 23 are connected to the junction points R and S, respectively, between each drain of the two transistors 51 and 53 or 54 and 52, respectively. The source and the drain of an equalizing P-channel MOS transistor 55 are connected between the junction points R and S, and the gate of the MOS transistor 55 is connected to the clock input terminal 56. When all the transistors 51 to 55 for clamping and equalizing operations and an active load are made up of P-channel MOS transistors, it is possible to facilitate the pattern layout inside the integrated circuit.

Further, each area of the clamping MOS transistors 51 and 52 is determined to be three times, for instance, greater than that of the active-load MOS transistors 53 and 54 and the equalizing MOS transistor 55. The remaining circuit configuration of FIG. 4, other than the above, is the same as the prior art driver shown in FIG. 1.

The operation of the embodiment is as follows: First, an assumption is made that the initial condition in the memory cell 10A is the same as that of the prior-art case, and further that the potential of the bit line 22 is between the supply voltage $V_{DD}$ and the grounded potential and that of the $\overline{\text{bit}}$ line 23 is equal to the supply voltage $V_{DD}$.

Figure 5:
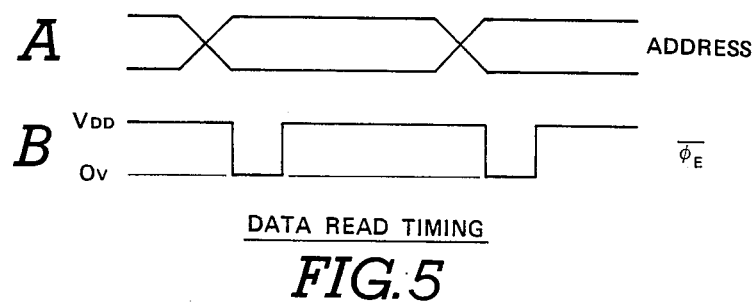
FIG. 5 is a waveform diagram showing the data read timing for assistance in explaining the operation of the bit line in FIG. 4.

Then, in response to an address input as shown in FIG. 5(A), a clock $\phi_E$ as shown in FIG. 5(B) is generated by an address transition detector (not shown), and this clock $\phi_E$ is supplied from the input terminal 56 to the gate of the equalizing MOS transistor 55. If the clock $\phi_E$ changes to an "L" voltage level, since the gate of the P-channel MOS transistor 55 is at the grounded potential, the transistor 55 is turned on.

In this embodiment, the source and the drain potentials of the equalizing MOS transistor 55 at points P and S are about 4.5 V, if the supply voltage $V_{DD}$ is 5 V, for instance, because of the influence of the threshold voltage Vth of the diode-connected P-channel MOS transistors 51 and 52 as described later. Therefore, the on-resistance of the equalizing MOS transistor 55 is sufficiently low, and it is possible to perfectly short between the bit line 22 and the $\overline{\text{bit}}$ line 23 without providing such a precharging MOS transistor as in the prior art driver. Further, the potentials of the bit line 22 and the $\overline{\text{bit}}$ line 23 are the same value $V_{EQ}$ as shown by the solid line 5 in FIG. 6.

During the non-equalization time interval, since the clock $\phi_E$ changes to an "H" voltage level, the equalizing MOS transistor 55 is turned off, because the gate voltage thereof rises up to the supply voltage $V_{DD}$, releasing the connection between the bit line 22 and the $\overline{\text{bit}}$ line 23. Since the MOS transistor 14 in the memory cell 10A is off, no absorption current $I_B$ flows into the $\overline{\text{bit}}$ line 23, the stray capacitance $C_{23}$ being charged through the active load MOS transistor 54. Therefore, the potential of the $\overline{\text{bit}}$ line 23 rises up to the supply voltage $V_{DD}$ as shown by the solid line 6 in FIG. 6, reaching a predetermined reference potential $V_{RT}$ at time $T_1$, as shown by point 6a in FIG. 6.

On the other hand, since the MOS transistors 13 and 15 in the memory cell 10 are both on, an absorption current $I_B$ flows into the bit line 22 through the active load MOS transistor 53. As described above, since the area of this MOS transistor 53 is determined to be relatively small, the equivalent resistance value is relatively high. Therefore, the potential of the bit line 22 drops sharply as shown by the solid line 4 in FIG. 6, reaching a predetermined reference potential $V_{RB}$ at time $t_1$, as shown by point 4a in FIG. 6.

Therefore, a data signal rising sharply and a data signal falling sharply are generated in the bit line 22 and the $\overline{\text{bit}}$ line 23, respectively, as shown by the solid lines 4 and 6 in FIG. 6. Thus, it is possible to shorten the access time.

Further, in this embodiment, as already described, the bit line 22 and the $\overline{\text{bit}}$ line 23 are connected to the supply voltage terminal $T_p$ through clamping MOS transistors 51 and 52 having a relatively large area, respectively. Therefore, when the voltage drop of the active-load MOS transistor 53 or 54 due to the absorption current $I_B$ or $\overline{I_B}$ into the memory cell 10 is about to exceed the threshold voltage Vth of the clamping MOS transistor 51 or 52, a large current flows through the MOS transistor 51 or 52, the potential at point R or S is sharply clamped at a predetermined clamp voltage $V_{CH}$. Therefore, the equalized level $V_{EQ}$ of the present embodiment is a mean value of the supply voltage $V_{DD}$ and the clamp voltage $V_{CH}$. In the case where the supply voltage $V_{DD}$ is 5 V, for instance, the clamp voltage $V_{CH}$ is about 4 V and therefore the equalized level $V_{EQ}$ is about 4.5 V.

Further, when data "0" is written in the memory cell 10A, the potential of the bit line 22 or the $\overline{\text{bit}}$ line 23 is driven to near the ground potential by a writing drive amplifier (not shown). In order to start the read operation immediately after this, it is necessary to recover the potential of the bit line 22 and the $\overline{\text{bit}}$ line 23 to the equalize level $V_{EQ}$ (write recovery). In the present embodiment, however, since there are provided clamping MOS transistors 51 and 52 having a relatively great area, the recovery time is short and thus advantageous to high-speed operation.

As described above, in the present invention, since there are provided active-load MOS transistors 53 and 54 separately from the clamping MOS transistors 51 and 52, the constants of each MOS transistor 51 to 54 can be determined independently from each other with respect to the already-mentioned two contradictory conditions of sharp clamping characteristics and high load resistance. Thus, it is possible to readily realize an optimum characteristic suitable for high speed operation.

Further, in the present embodiment, since the P-channel MOS transistors 51 and 52 are used for the clamping transistors, the potential of the bit line 22 and the $\overline{\text{bit}}$ line 23 in equalizing operation, that is, the equalize level $V_{EQ}$ is sufficiently high without being subjected to the influence of the substrate effect as in the prior art driver. Therefore, the on-resistance of the equalizing MOS transistor 55 can be reduced to a sufficiently low value, without a need for special precharging MOS transistors. This allows the load of the clock amplifier to be light, so that it is possible to obtain an accurate clock signal without a use of a high power amplifier and yet realize a stable operation.

Furthermore, in this embodiment, since the equalize level $V_{EQ}$ is high as described above, the diffusion capacitance included in the stray capacitances $C_{22}$ and $C_{23}$ of the bit line 22 and the $\overline{\text{bit}}$ line 23 is small, thus allowing the driver to be more advantageous to a high-speed operation.

As described above, according to the present invention, since the P-channel clamping MOS transistors (51, 52) and the active-load transistors (53, 54) are provided separately, it is possible to obtain a bit line driver which can realize optimum characteristics readily, reduce the access time, eliminate the precharging MOS transistors, and drive bit lines stably in response to a low power clock pulse.

What is claimed is:

1. A bit line driver connected between a pair of complementary bit lines and having an equalizing MOS transistor for effecting equalization operation by shorting a pair of the complementary bit lines in response to a clock pulse applied to a gate of the equalizing MOS transistor, which comprises:
    (a) a pair of active-load MOS transistors, each respectively connected between one of the complementary bit lines and a power supply, a gate of each of said active-load MOS transistors being connected to ground; and
    (b) a pair of clamping MOS transistors each respectively connected in parallel to one of said active-load MOS transistors, each of said clamping MOS transistors being diode connected;
    wherein the area of said clamping MOS transistors is about three times greater than that of said active-load MOS transistors and the equalizing MOS transistor.

2. The bit line driver as set forth in claim 1, wherein said equalizing MOS transistor, said pair of active-load MOS transistors and said pair of clamping MOS transistors are all P-channel type, a drain of each of said pair of active-load P-channel MOS transistors being respectively connected to one of a pair of the complementary bit lines; a source of each of said pair of active-load P-channel MOS transistors being connected to the power supply; and each drain and each source of said pair of clamping P-channel MOS transistors being connected in parallel to each drain and each source of said pair of active-load P-channel MOS transistors.

3. In a memory circuit which includes a pair of complementary bit lines, a power supply source, and a clock pulse source, together in circuit with an equalizing MOS transistor having a source and a drain in circuit with said complementary bit lines for effecting an equalization operation in response to a clock pulse applied to a gate of the equalizing MOS transistor, a combination which comprises:
    (a) a first clamping MOS transistor which includes a source in circuit with said power supply, a gate in circuit with a drain of said first clamping MOS transistor, said gate and said drain being in circuit with the source to drain path of said equalizing MOS transistor;
    (b) a first active load MOS transistor which includes a source in circuit with said power supply, a grounded gate, and a drain in circuit with the gate and drain of said first clamping MOS transistor and said source to drain path of said equalizing MOS transistor;
    (c) a second active load MOS transistor which includes a source in circuit with said power supply, a grounded gate, and a drain in circuit with the source to drain path of said equalizing transistor; and
    (d) a second clamping MOS transistor which includes a source connected to said power supply, a gate connected to a drain of said second clamping MOS transistor, said gate and said drain of said second clamping MOS transistor being in circuit with the source to drain path of said equalizing transistor and with the drain of said second active load MOS transistor;
    wherein the area of at least one of the first and second clamping MOS transistors is at least three times greater than the area of the first and the second active-load MOS transistors and the equalizing MOS transistor, so that the resistance of said clamping MOS transistors is relatively low, whereby the rate of change of potential during switching on said complementary bit lines is increased, thus shortening access time.

4. The combination as set forth in claim 3, wherein said equalizing MOS transistor, each of said active-load MOS transistors, and each of said first and said second clamping MOS transistors are P-channel type transistors, said first clamping MOS transistor and said first active load MOS transistor being connected to one of a pair of the complementary bit lines, said second clamping MOS transistor and said second active load transistor being connected to the other of said pair of said complementary bit lines.

5. The combination as set forth in claim 4, wherein said complementary bit lines are connected to a read amplifier for reading data in a memory cell accessed by a signal on a word line.

6. A bit line driver connected between a pair of complementary bit lines and having an equalizing MOS transistor for effecting equalization operation by shorting a pair of the complementary bit lines in response to a clock pulse applied to a gate of the equalizing MOS transistor, which comprises:
(a) a pair of active-load MOS transistors, each respectively connected between one of the complementary bit lines and a power supply, a gate of each of said active-load MOS transistor being connected to a common connection; and
(b) a pair of clamping MOS transistors each respectively connected in parallel to one of said active-load MOS transistors, each of said clamping MOS transistors being diode connected, each of said clamping transistors having an area at least about three times greater than that of said active-load MOS transistors and said equalizing MOS transistor.

7. The bit line driver as set forth in claim 6, wherein said common gate connection of said pair of active-load MOS transistors is grounded.

8. The bit line driver as set forth in claim 6, wherein said equalizing MOS transistor, said pair of active-load MOS transistors and said pair of clamping MOS transistors are all P-channel type transistors.

* * * * *